(12) United States Patent
Entani

(10) Patent No.: US 7,904,637 B2
(45) Date of Patent: Mar. 8, 2011

(54) INFORMATION PROCESSING APPARATUS, LIFETIME MONITORING METHOD AND PROGRAM FOR MONITORING LIFETIME OF STORAGE DEVICE INCLUDING FLASH MEMORY

(75) Inventor: Naruto Entani, Kawasaki (JP)

(73) Assignee: NEC Infrontia Corporation, Kanagawa (JP)

( * ) Notice: Subject to any disclaimer, the term of this patent is extended or adjusted under 35 U.S.C. 154(b) by 1004 days.

(21) Appl. No.: 11/436,644

(22) Filed: May 19, 2006

(65) Prior Publication Data

US 2006/0265545 A1    Nov. 23, 2006

(30) Foreign Application Priority Data

May 20, 2005    (JP) .................................. 2005-148128

(51) Int. Cl.
G06F 12/00    (2006.01)
(52) U.S. Cl. .................................. 711/103; 711/E12.008
(58) Field of Classification Search .................. None
See application file for complete search history.

(56) References Cited

U.S. PATENT DOCUMENTS

| 6,000,006 | A  | * | 12/1999 | Bruce et al. ................. | 711/103 |
| 6,249,838 | B1 | * | 6/2001  | Kon ............................. | 711/103 |
| 7,533,214 | B2 | * | 5/2009  | Aasheim et al. .............. | 711/103 |
| 2006/0155917 | A1 | * | 7/2006 | Di Sena et al. .............. | 711/103 |

FOREIGN PATENT DOCUMENTS

| JP | 06-124596  | 5/1994  |
| JP | 9-305497   | 11/1997 |
| JP | 2000-20252 | 1/2000  |
| JP | 2000-57000 | 2/2000  |
| JP | 2004-152331| 5/2004  |
| JP | 2004-240572| 8/2004  |
| JP | 2004-280187| 10/2004 |

* cited by examiner

Primary Examiner — Kaushikkumar Patel
(74) Attorney, Agent, or Firm — Young & Thompson

(57) ABSTRACT

A judging unit determines whether an accumulated rewrite count management table is in a flash memory. If the accumulated rewrite count management table is not in the flash memory, then a generating unit generates an accumulated rewrite count management table in the flash memory, and a recording unit records an accumulated rewrite count in the accumulated rewrite count management table which is generated. A monitoring unit monitors the lifetime of a storage device based on the accumulated rewrite count recorded in the accumulated rewrite count management table and a rewrite count limitative value recorded in the flash memory.

10 Claims, 4 Drawing Sheets

Fig. 3

22b ACCUMULATED REWRITE COUNT MANAGEMENT TABLE
- 401 STORAGE MODEL NAME
- 402 SERIAL NUMBER
- 403 TABLE GENERATION DATE
- 404 NUMBER OF ERASURE BLOCKS
- 405 ACCUMULATED REWRITE COUNTS OF BLOCK1
- 406 ACCUMULATED REWRITE COUNTS OF BLOCK2
- 407 ACCUMULATED REWRITE COUNTS OF BLOCK3
- 408 IDENTIFICATION LINE OF FINAL LINE

```
Model Number : STRAGE1
SERIAL Number : ABCDEFG
START : 2004/11/23
CAPACITY : 4000
000012
000000
002F2C
  .
  .
  .
END[EOF]
```

INFORMATION PROCESSING APPARATUS, LIFETIME MONITORING METHOD AND PROGRAM FOR MONITORING LIFETIME OF STORAGE DEVICE INCLUDING FLASH MEMORY

BACKGROUND OF THE INVENTION

1. Field of the Invention

The present invention relates to an information processing apparatus, a lifetime monitoring method, and a program, and more particularly to an information processing apparatus, a lifetime monitoring method, and a program for monitoring the lifetime of a storage device including a flash memory.

2. Description of the Related Art

Hard disk drives have heretofore been in widespread usage as storage devices for use with information processing apparatus.

At present, however, the reliability of hard disk drives is not high enough. Therefore, systems which demand high operational reliability find it necessary to periodically replace the hard disk drive used therein or to have a backup storage device connected to the information processing apparatus in order to make up for the reliability shortage of the hard disk drive.

In recent years, semiconductor flash memories have been substantially improved in storage capacity and cost. Storage devices employing semiconductor flash memories are more reliable than hard disk drives. At present, therefore, storage devices employing semiconductor flash memories are used as storage devices for use with information processing apparatus.

The flash memory is, however, problematic in that storage elements thereof deteriorate when they repeatedly erase and rewrite information.

JP-A No. 2000-57000 discloses a microcomputer incorporating a flash memory. The disclosed microcomputer has a function that monitors the flash memory.

Specifically, the microcomputer has a nonvolatile memory, which is different from the flash memory, for storing a guaranteed rewrite count for the flash memory and an actual rewrite count for the flash memory. When the actual rewrite count exceeds the guaranteed rewrite count, an alarm signal is output.

JP-A No. H09-305497 discloses a recording and reproducing apparatus for monitoring each sector of a flash memory.

Specifically, a guaranteed erasure count and an accumulated erasure count for each sector are stored in the flash memory. When the accumulated erasure count exceeds the guaranteed erasure count, the information, which indicates that the accumulated erasure count exceeds the guaranteed erasure count, is reported to a microcomputer.

According to the microcomputer disclosed in JP-A No. 2000-57000 and the recording and reproducing apparatus disclosed in JP-A No. H09-305497, a storage area for storing the rewrite count is preset, and the rewrite count is stored in the preset storage area.

If such a storage area is not preset, then the rewrite count cannot be stored, and hence the flash memory cannot be monitored for deterioration.

SUMMARY OF THE INVENTION

It is an object of the present invention to provide an information processing apparatus, a lifetime monitoring method, and a program which are capable of monitoring a flash memory even if there is no storage area, which has been preset, for storing a rewrite count.

To achieve the above object, an information processing apparatus according to the present invention is adapted to be connected to a storage device including a flash memory that has stored a rewrite count limitative value. The information processing apparatus rewrites information stored in the flash memory and monitors the lifetime of the storage device using the rewrite count limitative value. The information processing apparatus has a judging unit, a generating unit, a recording unit, and a monitoring unit.

The judging unit judges whether a management table for managing an accumulated rewrite count is in the flash memory or not.

The generating unit generates the management table in the flash memory if the judging unit judges that the management table is not in the flash memory.

The recording unit records an accumulated rewrite count, which is indicative of the number of times that the information is rewritten, into the management table that is generated by the generating unit.

The monitoring unit monitors the storage device for the lifetime thereof based on the accumulated rewrite count recorded in the management table and the rewrite count limitative value.

With the above arrangement, if the management table is not in the flash memory, a management table is generated in the flash memory, and an accumulated rewrite count is recorded in the management table. The storage device is monitored for its lifetime based on the accumulated rewrite count recorded in the management table and the rewrite count limitative value recorded in the flash memory.

Therefore, even if the management table for storing rewrite counts is not preset, it is possible to monitor the life of the storage device.

Desirably, the information processing apparatus may further be arranged as follows:

The flash memory has a plurality of storage areas each capable of rewriting information.

The recording unit records the accumulated rewrite count of each of the storage areas into the management table.

The monitoring unit monitors the storage device for the lifetime thereof based on the accumulated rewrite count of each of the storage areas recorded in the management table and the rewrite count limitative value.

With the above arrangement, it is possible to monitor the lifetime of the storage device including the flash memory which is capable of rewriting information in each of the storage areas.

Desirably, the information processing apparatus may also be arranged as follows:

The flash memory stores a model name of the storage device which is connectable to the information processing apparatus and the rewrite count limitative value of the flash memory included in the storage device having the stored model name, in association with the model name, and permanently stores the model name of the storage device which includes the flash memory.

The information processing apparatus further has an acquiring unit for acquiring the model name of the storage device which includes the flash memory from the flash memory, and acquiring the rewrite count limitative value associated with the model name of the storage device from the flash memory.

The monitoring unit monitors the storage device for the lifetime thereof based on the accumulated rewrite count acquired by the acquiring unit and the accumulated rewrite count of each of the storage areas recorded in the management table.

With the above arrangement, it is possible to acquire the rewrite count limitative value depending on the storage device which is actually connected. Accordingly, the lifetime of the storage device can accurately be monitored.

Desirably, the information processing apparatus may further be arranged as follows:

The flash memory permanently stores identification information for identifying the storage device which includes the flash memory.

The acquiring unit further acquires the identification information from the flash memory when the information processing apparatus is activated.

The judging unit judges whether the management table is in the flash memory or not when the information processing apparatus is activated.

The recording unit records the identification information that is acquired by the acquiring unit into the management table that is generated by the generating unit if the judging unit judges that the management table is not in the flash memory;

The information processing apparatus further includes an obtaining unit and a determining unit.

The obtaining unit obtains the identification information from the management table if the judging unit judges that the management table is in the flash memory.

The determining unit determines whether the storage device has been replaced or not by comparing the identification information that is obtained by the obtaining unit and the identification information that is acquired by the acquiring unit.

The generating unit deletes the management table and thereafter generates a new management table in the flash memory if the determining unit determines that the storage device has been replaced.

With the above arrangement, when the storage device is replaced with a new storage device, if the information, exclusive of the identification information, stored in the storage device is copied to the new storage device, the accumulated rewrite count, which is copied to the new storage device, is initialized.

Therefore, even if the information stored in the storage device is copied to the new storage device, the lifetime of the new flash memory can be monitored with high accuracy.

The information processing apparatus should preferably further include a nonvolatile memory for storing the same management table as the management table that is generated in the flash memory.

Even if the management table that is generated in the flash memory cannot be referred to due to a failure of the flash memory or the like, it is possible to refer to the management table that is stored in the nonvolatile memory.

Preferably, when a value, which is produced by subtracting the accumulated rewrite count from the rewrite count limitative value, is equal to or smaller than a predetermined value, an alarm should be issued.

The alarm allows the user to know that the lifetime of the storage device has elapsed.

The above and other objects, features, and advantages of the present invention will become apparent from the following description with reference to the accompanying drawings which illustrate an example of the present invention.

BRIEF DESCRIPTION OF THE DRAWINGS

FIG. 3 is a diagram showing data stored in an accumulated rewrite count management table by way of example.

DETAILED DESCRIPTION OF THE PREFERRED EMBODIMENT

Figure 1:
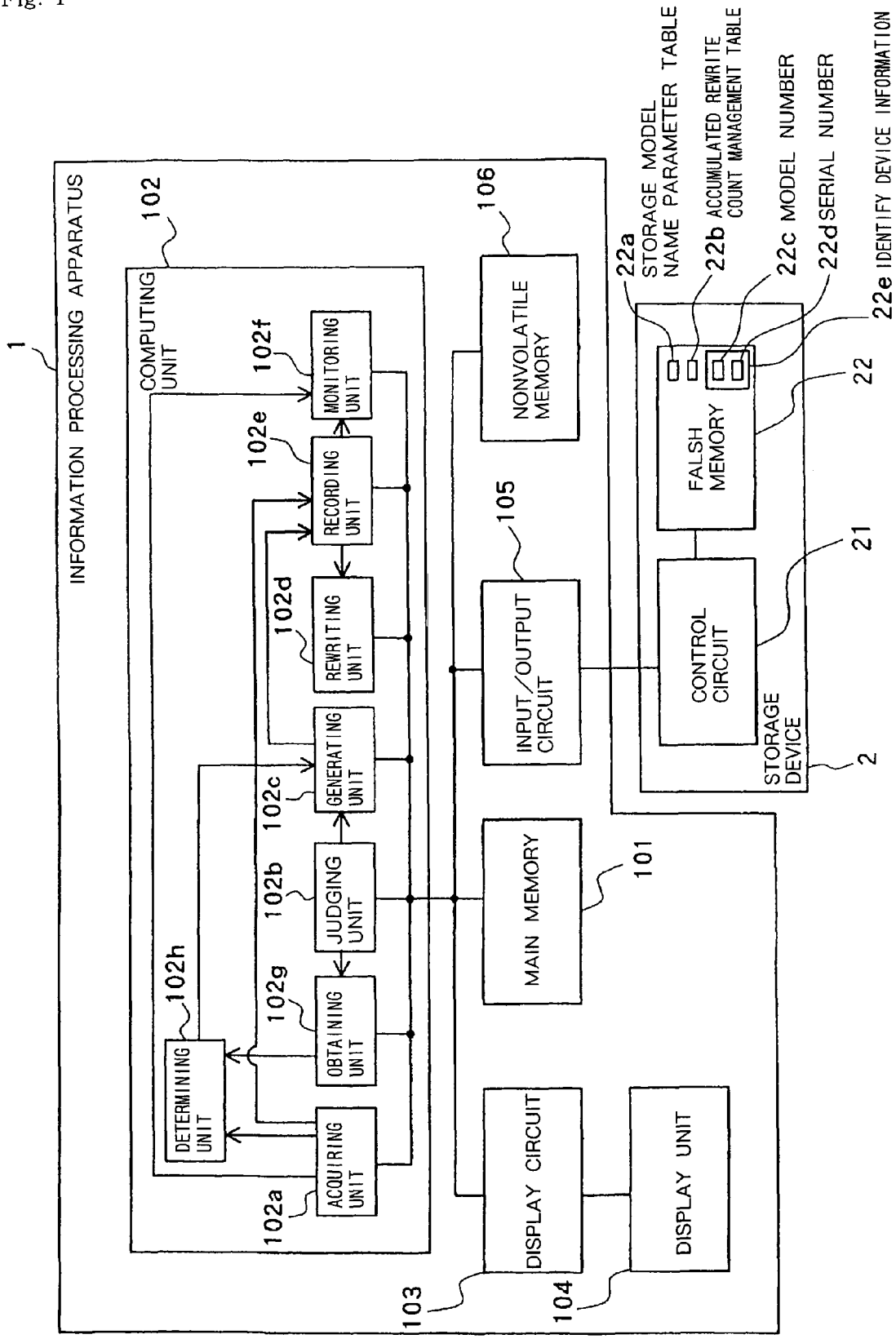
FIG. 1 is a block diagram of an information processing apparatus according to an embodiment of the present invention.

FIG. 1 shows in block form an information processing apparatus according to an embodiment of the present invention.

As shown in FIG. 1, information processing apparatus 1 is connected to storage device 2. Storage device 2 can be removed from information processing apparatus 1. Storage device 2 may be a standardized, commercially available storage device such as a compact flash memory card or an SD memory card.

Information processing apparatus 1 comprises main memory 101, computing unit 102, display circuit 103, display unit 104, input/output circuit 105, and nonvolatile memory 106. Storage device 2 comprises control circuit 21 and flash memory 22.

Main memory 101 comprises a recording medium which can be read by a computer, for example. Main memory 101 stores an execution program for controlling operation of information processing apparatus 1.

Computing unit 102 comprises a computer, for example. Computing unit 102 reads the execution program that is stored in main memory 101, and executes the execution program to perform various processes.

For example, computing unit 102 executes the execution program to implement functions as acquiring unit 102a, judging unit 102b, generating unit 102c, rewriting unit 102d, recording unit 102e, monitoring unit 102f, obtaining unit 102g, and determining unit 102h.

Display circuit 103 supplies a display signal to display unit 104.

When display unit 104 receives the display signal from display circuit 103, display unit 104 displays information represented by the display signal.

Input/output circuit 105 is connected to storage device 2, specifically control circuit 21.

Input/output circuit 105 is controlled by computing unit 102 to supply a reading request and a writing request to control circuit 21. Stated otherwise, computing unit 102 controls input/output circuit 105 to read data such as file data, etc. stored in storage device 2 and write data such as file data, etc. into storage device 2.

In storage device 2, control circuit 21 interprets the reading request and the writing request. Control circuit 21 reads data from and write data into flash memory 22 based on the interpreted requests.

Control circuit 21 is controlled by computing unit 102 to display desired data on display unit 104 through display circuit 103.

Nonvolatile memory 106 keeps data stored therein even if the power supply of information processing apparatus 1 is turned off. Computing unit 102 can read data that is stored in nonvolatile memory 106 and write data into nonvolatile memory 106.

Flash memory 22 manages data when data is written therein with respect to each of basic management areas thereof which has a certain size called "page".

Flash memory 22 erases data from a plurality of pages thereof altogether. Such a plurality of pages of flash memory 22 serve as a basic erasure area called "erasure block".

Therefore, when data written in flash memory 22 is rewritten, it is erased from an erasure block or a plurality of erasure blocks, and then updated data is rewritten into a page or a plurality of pages.

When data are repeatedly erased from flash memory 22 and repeatedly written into flash memory 22, flash memory 22 has its storage elements deteriorated from repeated use. Therefore, flash memory 22 has a rewrite endurance count, i.e., a count by which data can repeatedly be written into flash memory 22, that is set to a predetermine value.

If data is rewritten in a certain erasure block more times than the rewrite endurance count, then the storage elements in the certain erasure block fail to operate, so that no data can be read from the certain erasure block and new data can't be written into the certain erasure block. As a result, control circuit 21 possibly returns an error signal in response to the reading request and the writing request.

Generally, the storage capacity of flash memories and the size of the erasure block thereof are not standardized, and vary from storage device type (model name).

Storage device 2, specifically flash memory 22, stores storage model name parameter table (hereinafter referred to simply as "table") 22a, accumulated rewrite count management table (hereinafter referred to simply as "table") 22b, model number 22c of storage device 2, and serial number 22d of storage device 2. Model number 22c and serial number 22d are inhibited from being rewritten.

Figure 2:
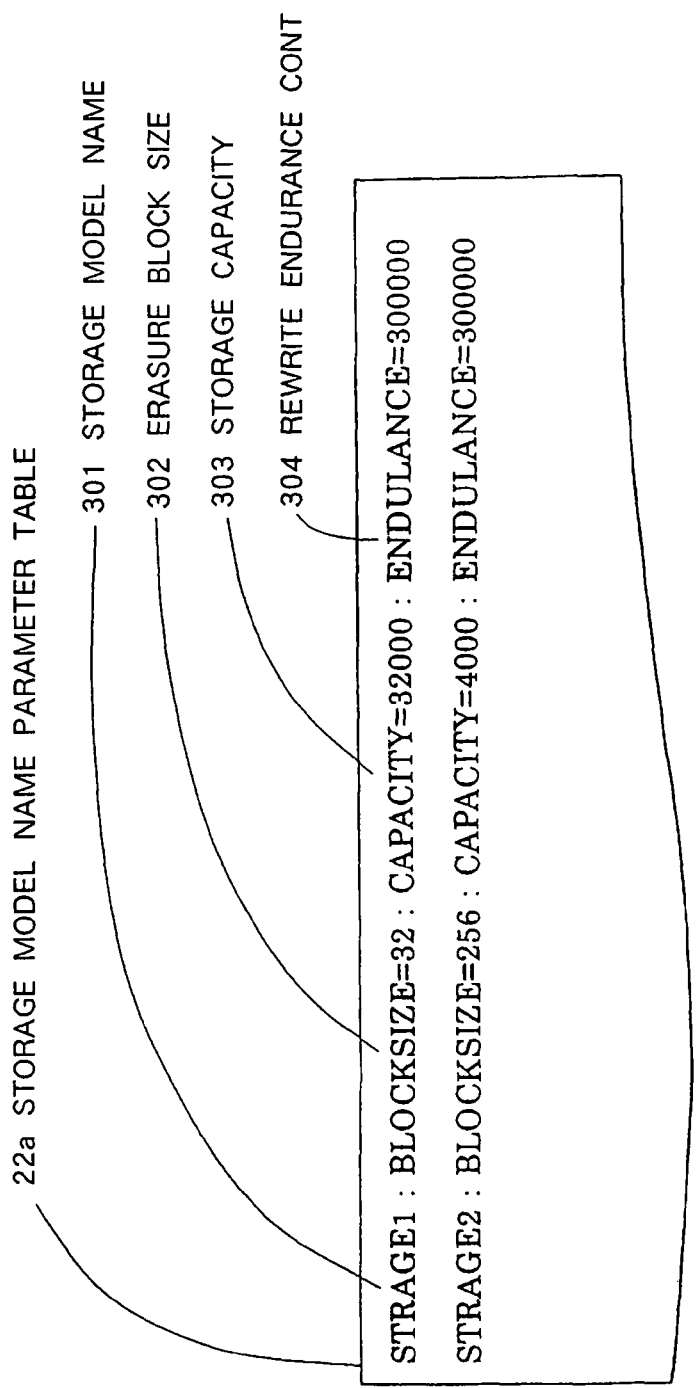
FIG. 2 is a diagram showing data stored in a storage model name parameter table by way of example.

FIG. 2 shows data stored in table 22a by way of example.

In table 22a, as shown in FIG. 2, storage model name 301, erasure block size 302, storage capacity 303, and rewrite endurance count 304 are associated with each other for each storage model name 301.

Storage model name (STORAGE) 301 represents a storage model name (type) that can be used with information processing apparatus 1.

Erasure block size (BLOCKSIZE) 302 represents an erasure block size, which is expressed as the number of sectors, of flash memory 22 included in the storage device having the storage model name that is related to erasure block size 302.

The term "sector" represents a data management unit of the storage device. The storage device uses one sector or a plurality of sectors as one page. The storage device writes data into pages of the flash memory.

Storage capacity (CAPACITY) 303 represents a total storage capacity, which is expressed as the number of sectors, of the storage device having the storage model name related to storage capacity 303.

Rewrite endurance count (ENDURANCE) 304 represents a limitative value for the rewrite count for each of the erasure blocks of the storage device having the storage model name related to rewrite endurance count 304.

FIG. 3 shows data stored in table 22b by way of example.

According to the present embodiment, table 22b is placed under a file name "ERASECOUNT.txt" in the root directory of flash memory 22. The storage location and name of table 22b are not limited to those described above, but may be a predetermined storage location and a predetermined name.

As shown in FIG. 3, table 22b stores therein storage model name (Model Number) 401, serial number (SERIAL Number) 402, table generation date (START) 403, and number 404 of erasure blocks (CAPACITY) which are recorded successively from the beginning of the file. Table 22b also stores therein accumulated rewrite counts 405, 406, 407, . . . for respective erasure blocks, which are recorded successively line by line after number 404 of erasure blocks. Table 22b stores final line identification line 408, which indicates a final line, at the end of the file.

The specific data shown in FIG. 3 include "STORAGE1" as storage model name 401, "ABCDEFG" as serial number 402, "4000" as the total number 404 of erasure blocks, and "12" as accumulated rewrite count 405 for erasure block 1. The erasure blocks are numbered according to the sequence of logical addresses of flash memory 22.

When storage device 2 is in an initial state, table 22b does not exist in flash memory 22.

Storage devices have their own unique serial numbers. In FIG. 1, therefore, serial number 22d is uniquely assigned to storage device 2, and hence serves as identification information of storage device 2.

If storage device 2 is pursuant to the ATA protocol, then flash memory 22 stores Identify Device information 22e that represents model name 22c of storage device 2 and serial number 22d of storage device 2. Identify Device information 22e is defined by the ATA protocol that is standardized for IDE-HDDs. Identify Device information 22e is inhibited from being rewritten.

When information processing apparatus 1 is activated, acquiring unit 102a of computing unit 102 acquires Identify Device information 22e from flash memory 22.

When acquiring unit 102a acquires Identify Device information 22e, acquiring unit 102a acquires model name 22c and serial number 22d from Identify Device information 22e.

When acquiring unit 102a acquires model name 22c, acquiring unit 102a acquires, from table 22a, erasure block size 302, storage capacity 303, and rewrite endurance count 304 which are related to model name 22c (see FIG. 2).

Acquiring unit 102a supplies the acquired information, i.e., model name 22c, serial number 22d, erasure block size 302, and storage capacity 303, to recording unit 102e.

Acquiring unit 102a also supplies serial number 22d to determining unit 102h.

Acquiring unit 102a supplies rewrite endurance count 304 to monitoring unit 102f. When monitoring unit 102f receives rewrite endurance count 304, monitoring unit 102f stores rewrite endurance count 304 therein.

Judging unit 102b determines whether table 22b is present in flash memory 22 or not. For example, when information processing apparatus 1 is activated, judging unit 102b determines whether table 22b is present in flash memory 22 or not.

According to the present embodiment, judging unit 102b first determines whether there is a file having a file name "ERASECOUNT.txt" in the root directory of flash memory 22 or not.

If it is determined that there is a file having a file name "ERASECOUNT.txt" in the root directory of flash memory 22, then judging unit 102b determines whether the file having the file name has the data format shown in FIG. 3 or not.

If there is a file having a file name "ERASECOUNT.txt" in the root directory of flash memory 22a and also if the file having the file name has the data format shown in FIG. 3, then judging unit 102b determines that table 22b is present in flash memory 22. Thereafter, judging unit 102b supplies the result of the determination to obtaining unit 102g.

If there is not a file having a file name "ERASECOUNT.txt" in the root directory of flash memory 22 or if the file having the file name has a data format that is different from the data format shown in FIG. 3, then judging unit 102b determines that table 22b is not present in flash memory 22. Thereafter, judging unit 102b supplies the result of the determination to generating unit 102c.

When generating unit 102c receives the result of the determination indicating that table 22b is not present in flash memory 22, generating unit 102c generates table 22b (see FIG. 3) in flash memory 22.

Table 22b that is generated by generating unit 102c does not contain information about storage device 2.

When generating unit 102c generates table 22b, generating unit 102c supplies a generation notification to recording unit 102e.

When recording unit 102e receives the generation notification, recording unit 102e records information about storage device 2 in table 22b generated by generating unit 102c.

Specifically, recording unit 102e records model name 22c received from acquiring unit 102a as storage model name 401.

Then, recording unit 102e records serial number 22d received from acquiring unit 102a as serial number 402.

Then, recording unit 102e acquires the present date from a clock, not shown, and records the acquired date as table generation date 403.

Then, recording unit 102e records a value that is produced by dividing storage capacity 303 received from acquiring unit 102a by erasure block size 302 received from acquiring unit 102a, as number 404 of erasure blocks. If a remainder occurs from the division, then recording unit 102e records a value that is produced by adding 1 to the quotient of the division, as number 404 of erasure blocks.

Then, recording unit 102e records the accumulated rewrite counts of the respective erasure blocks according to the sequence of logical addresses (sector addresses) of flash memory 22. At this time, recording unit 102e stores "0" ("000000" in FIG. 3) as the accumulated rewrite count of each of the erasure blocks.

Finally, recording unit 102e records "END" as the final line identification line.

When recording unit 102e has recorded "END" in table 22b, recording unit 102e sets the file name of table 22b to "ERASECOUNT.txt", and thereafter stores table 22b having the file name in the root directory of flash memory 22.

When information processing apparatus 1 is activated, recording unit 102e also generates an updated rewrite count table in main memory 101.

The updated rewrite count table holds the rewrite counts of the respective erasure blocks in flash memory 22 while information processing apparatus 1 is being activated.

When the updated rewrite count table is generated, recording unit 102e initializes the updated rewrite count table in order to set the rewrite counts of the respective erasure blocks to "0".

The recording unit 102e supplies the associative relationship between the erasure blocks and the sector addresses (logical addresses) corresponding to the erasure blocks to rewriting unit 102d.

Rewriting unit 102d rewrites date recorded in flash memory 22.

Specifically, rewriting unit 102d supplies a sector address, which indicates the position of a sector where data is to be rewritten, and data, which is to be newly written into the sector, to control circuit 21 through input/output circuit 105. Then, rewriting unit 102d supplies a date rewriting request to control circuit 21 through input/output circuit 105.

When control circuit 21 receives the data rewriting request after having received the sector address and the data, control circuit 21 writes the data in flash memory 22.

Specifically, control circuit 21 specifies an erasure block containing the sector that is specified by the sector address.

Thereafter, control circuit 21 reads the data stored in the erasure block, and then erases the data stored in the erasure block.

Then, control circuit 21 updates, among the read data, the data of the sector specified by the sector address received from input/output circuit 105, into the data received from input/output circuit 105.

Thereafter, control circuit 21 writes the data including the updated data into a page that is included in the erasure block, thereby completing the rewriting operation of storage device 2.

Each time rewriting unit 102d rewrites data, rewriting unit 102d updates the updated rewrite count table that is generated in main memory 101.

Specifically, rewriting unit 102d specifies an erasure block corresponding to the sector address that is supplied to control circuit 21. Then, rewriting unit 102d updates the rewrite count corresponding to the specified erasure block, which is recorded in the updated rewrite count table, into a numerical value that is produced by incrementing the rewrite count by "1".

When information processing apparatus 1 receives a shutdown instruction, recording unit 102a updates table 22b.

Specifically, recording unit 102e reads the rewrite counts of the respective erasure blocks from table 22b.

Then, recording unit 102e reads the rewrite counts of the respective erasure blocks that are recorded in the updated rewrite count table in main memory 101.

Then, recording unit 102e adds the rewrite count of each erasure block read from table 22b and the rewrite count of the erasure block read from the updated rewrite count table.

Then, recording unit 102e writes all the added accumulated rewrite counts back into table 22b.

Recording unit 102e also holds the data of accumulated rewrite count management table 22b that has been updated, in nonvolatile memory 106.

When the updating of table 22b is finished, recording unit 102e supplies an updating end notification to monitoring unit 102f.

When monitoring unit 102f receives the updating end notification, monitoring unit 102b monitors the lifetime of storage device 2 based on the accumulated rewrite counts of the erasure blocks which are recorded in table 22b and rewrite endurance count 304 acquired from flash memory 22.

For example, monitoring unit 102f determines whether or not a value (hereinafter referred to as "difference"), which is produced by subtracting each of the accumulated rewrite counts of the erasure blocks from rewrite endurance count 304, is equal to or smaller than a predetermined value.

The predetermined value should preferably be 0 or greater. Monitoring unit 102f determines whether the accumulated rewrite count of either one of the erasure blocks exceeds rewrite endurance count 304 or is about to exceed rewrite endurance count 304.

If the difference with respect to either one of the erasure blocks is equal to or smaller than the predetermined value, then monitoring unit 102f supplies an alarm display signal to display circuit 103.

In response to the alarm display signal, display circuit 103 controls display unit 104 to display an alarm indicating that the lifetime of storage device 2 has elapsed due to the repeated data rewriting.

If judging unit 102b determines that table 22b is present in flash memory 22, then obtaining unit 102g obtains serial number 402 from table 22b (see FIG. 3). Obtaining unit 102g supplies the obtained serial number 402 to determining unit 102h.

Determining unit 102h compares the serial number obtained by obtaining unit 102g and the serial number acquired by acquiring unit 102a with each other. If the serial number obtained by obtaining unit 102g and the serial number acquired by acquiring unit 102a are different from each other, then determining unit 102h determines that storage device 2 has been replaced.

Obtaining unit 102g obtains serial number 402 from table 22b that is rewritable, and acquiring unit 102a acquires serial number 22d from Identify Device information 22e that is inhibited from being rewritten.

The determining operation of determining unit 102h will be complemented below.

Basically, serial number 402 described in table 22b is supposed to be equal to serial number 22d represented by Identify Device information 22e. Therefore, these two serial numbers are normally not different from each other.

However, if the storage device with data written by information processing apparatus 1 is replaced with a new storage device at the end of its lifetime, then the data written in the old storage device is possibly copied to the new storage device.

At this time, if table 22b that has also been written in the old storage device is copied to the new storage device, then a situation occurs in which the serial number obtained by obtaining unit 102g and the serial number acquired by acquiring unit 102a are different from each other. Determining unit 102h determines whether such a situation has occurred or not.

If determining unit 102h determines that storage device 2 has been replaced, then determining unit 102h supplies a replacement notification to generating unit 102c.

In response to the replacement notification, generating unit 102c deletes table 22b from flash memory 22 and generates new table 22b in flash memory 22.

When generating unit 102c generates new table 22b, generating unit 102c supplies a generation notification to recording unit 102e.

When recording unit 102e receives the generation notification, recording unit 102e records information about storage device 2 in table 22b generated by generating unit 102c, as described above.

At this time, recording unit 102e initializes the accumulated rewrite count of each of the erasure blocks to "0". Accordingly, the rewrite count of replacing storage device 2 can accurately be counted.

Operation of information processing apparatus 1 will be described below with reference to FIG. 4.

Figure 4:
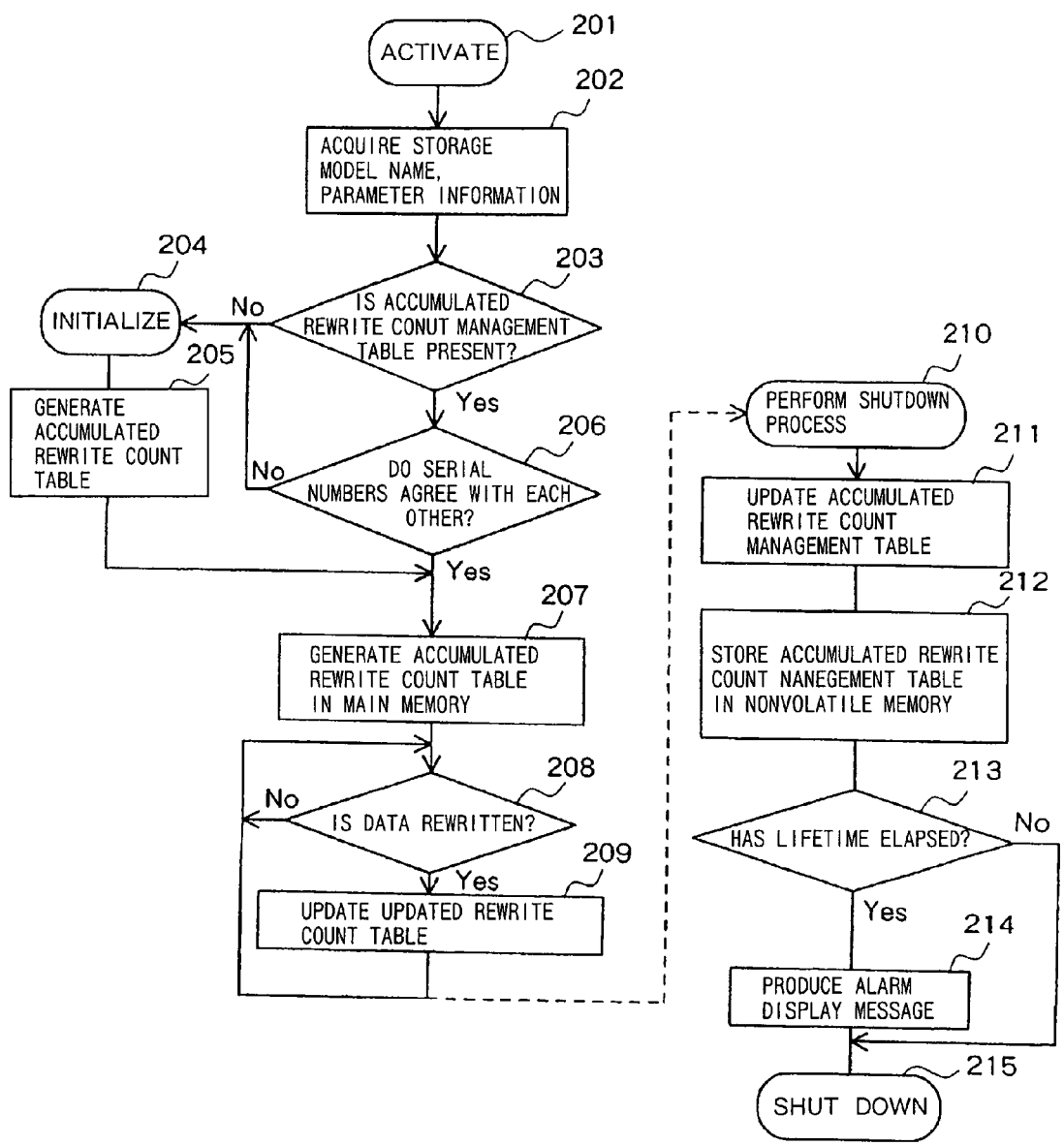
FIG. 4 is a flowchart of an operation sequence of the information processing apparatus.

FIG. 4 is a flowchart of an operation sequence of information processing apparatus 1.

In step 201, information processing apparatus 1 is activated.

When information processing apparatus 1 is activated, computing unit 102 executes the operation sequence described below according to the execution program stored in main memory 101.

In step 202, computing unit 102 acquires storage model name parameter information stored in storage device 2. The storage model name parameter information is recorded in table 22a.

Specifically, computing unit 102 acquires model name 22c of storage device 2 and serial number 22d of storage device 2. The acquiring operation is performed by acquiring unit 102a.

For example, if storage device 2 is a general hard disk drive pursuant to the ATA protocol, then acquiring unit 102a acquires model name 22c and serial number 22d of storage device 2 from Identify Device information 22e.

Acquiring unit 102a also acquires table 22a that has been stored in storage device 2.

Acquiring unit 102a obtains erasure block size 302, storage capacity (total storage capacity size) 303, and rewrite endurance count (an allowed rewrite count of each erasure block size) 304 from model name 22c of storage device 2 acquired from Identify Device information 22e and table 22a.

For example, acquiring unit 102a acquires erasure block size 302, storage capacity 303, and rewrite endurance count 304, which are associated with model name 22c of storage device 2 acquired from Identify Device information 22e, from table 22a.

Acquiring unit 102a supplies the acquired information, that is, model name 22c, serial number 22d, erasure block size 302, and storage capacity 303 to recording unit 102e.

Acquiring unit 102a also supplies serial number 22d to determining unit 102h.

Acquiring unit 102a supplies rewrite endurance count 304 to monitoring unit 102f. When monitoring unit 102f receives rewrite endurance count 304, i monitoring unit 102f stores rewrite endurance count 304 therein.

When computing unit 102 acquires the storage model name parameter information (erasure block size 302, storage capacity 303, and rewrite endurance count 304), computing unit 102 executes step 203.

In step 203, computing unit 102 confirms whether table 22b is present in storage device 2 or not.

If table 22b is present in storage device 2, then computing unit 102 executes step 206. If table 22b is not present in storage device 2, then computing unit 102 executes step 204. The confirmation is performed by judging unit 102b.

Specifically, judging unit 102b first determines whether there is a file having a file name "ERASECOUNT.txt" in the root directory of flash memory 22 or not.

If it is determined that there is a file having a file name "ERASECOUNT.txt" in the root directory of flash memory 22, then judging unit 102b determines whether the file having the file name has the data format shown in FIG. 3 or not.

If there is a file having a file name "ERASECOUNT.txt" in the root directory of flash memory 22a and also if the file having the file name has the data format shown in FIG. 3, then judging unit 102b determines that table 22b is present in flash memory 22. Thereafter, judging unit 102b supplies the result of the determination to obtaining unit 102g.

If there is not a file having a file name "ERASECOUNT.txt" in the root directory of flash memory 22 or if the file having the file name has a data format that is different from the data format shown in FIG. 3, then judging unit 102b determines that table 22b is not present in flash memory 22. Thereafter, judging unit 102b supplies the result of the determination to generating unit 102c.

When storage device 2 is in an initial state, table 22b does not exist in flash memory 22. Consequently, when computing unit 102 is first activated after storage device 2 in the initial state is connected to information processing apparatus 1, judging unit 102b cannot locate table 22b.

In step 204, computing unit 102 starts an initializing process for generating an "accumulated rewrite count management table" file. When computing unit 102 starts the initializing process, computing unit 102 executes step 205.

In step 205, computing unit 102 generates table 22b in storage device 2. Table 22b is generated by generator 102c. Information is recorded in generated table 22b by recording unit 102e. Specifically, generating 102c generates table 22b in flash memory 22. Information about storage device 2 is not recorded in table 22b generated by generating unit 102c.

When generating unit 102c generates table 22b, generating unit 102c supplies a generation notification to recording unit 102e.

When recording unit 102e receives the generation notification, recording unit 102e records information about storage device 2 in table 22b generated by generating unit 102c.

Specifically, recording unit 102e records model name 22c received from acquiring unit 102a as storage model name 401 in table 22b.

Then, recording unit 102e records serial number 22d received from acquiring unit 102a as serial number 402 in table 22b. Then, recording unit 102e acquires the present date from the non-illustrated clock, and records the acquired date as table generation date 403 in table 22b.

Then, recording unit 102e records a value (quotient) that is produced by dividing storage capacity 303 received from acquiring unit 102a by erasure block size 302 received from acquiring unit 102a, as number 404 of erasure blocks in table 22b. If a remainder occurs from the division, then recording unit 102e records a value that is produced by adding 1 to the quotient of the division, as number 404 of erasure blocks in table 22b.

Then, recording unit 102e records the accumulated rewrite counts of the respective erasure blocks according to the sequence of logical addresses in table 22b. At this time, recording unit 102e stores "0" as the accumulated rewrite count of each of the erasure blocks in table 22b.

Finally, recording unit 102e records "END" as the final line identification line in table 22b.

When recording unit 102e has recorded "END" in table 22b, recording unit 102e sets the file name of table 22b to "ERASECOUNT.txt", and thereafter stores table 22b having the file name in the root directory of flash memory 22.

After computing unit 102 stores table 22b in the root directory of flash memory 22, computing unit 102 executes step 207.

In step 206, computing unit 102 obtains serial number 402 from table 22b in flash memory 22, and determines whether serial number 402 coincides with serial number 22d acquired from Identify Device information 22e or not.

If serial number 402 coincides with serial number 22d, then computing unit 102 determines that storage device 2 has not been replaced, and executes step 207. If serial number 402 does not coincide with serial number 22d, then computing unit 102 determines that storage device 2 has been replaced, and executes step 204.

In computing unit 102, obtaining unit 102g obtains serial number 402 and determining unit 102h determines whether the serial numbers coincide with each other or not.

Specifically, if judging unit 102b determines that table 22b is present in flash memory 22, then obtaining unit 102g obtains serial number 402 from table 22b. Obtaining unit 102g supplies the obtained serial number 402 to determining unit 102h.

Determining unit 102h determines whether serial number 402 obtained by obtaining unit 102g coincides with serial number 22d acquired by acquiring unit 102a or not. If serial number 402 and serial number 22d are different from each other, then determining unit 102h determines that storage device 2 has been replaced.

In step 207, computing unit 102 generates an updated rewrite count table in main memory 101. The updated rewrite count table holds the rewrite count of each erasure block in flash memory 22 while information processing apparatus 1 is being activated. The updated rewrite count table is generated by recording unit 102e.

When the updated rewrite count table is generated, recording unit 102e initializes the updated rewrite count table in order to set the rewrite counts of the respective erasure blocks to "0". The recording unit 102e supplies the associative relationship between the erasure blocks and the sector addresses corresponding to the erasure blocks to rewriting unit 102d.

After computing unit 102 generates the updated rewrite count table, computing unit 102 executes step 208.

In step 208, computing unit 102 determines whether data in storage device 2 has been rewritten or not. Data in storage device 2 is rewritten by rewriting unit 102d.

Specifically, rewriting unit 102d supplies a sector address, which indicates the position of a sector where data is to be rewritten, and data, which is to be newly written into the sector, to control circuit 21 through input/output circuit 105. Then, rewriting unit 102d supplies a date rewriting request to control circuit 21 through input/output circuit 105.

When control circuit 21 receives the data rewriting request after having received the sector address and the data, control circuit 21 writes the data into flash memory 22.

If data in storage device 2 has been rewritten, then computing unit 102 executes step 209.

In step 209, computing unit 102 updates the updated rewrite count table generated in main memory 102. The updated rewrite count table is updated by rewriting unit 102d.

Specifically, rewriting unit 102d specifies an erasure block corresponding to the sector address that is supplied to control circuit 21. Then, rewriting unit 102d updates the rewrite count corresponding to the specified erasure block, which is recorded in the updated rewrite count table, into a numerical value that is produced by incrementing the rewrite count by "1".

After computing unit 102 updates the updated rewrite count table, computing unit 102 executes step 208. Therefore, rewriting unit 102d records the rewrite count of each erasure block during continued operation of computing unit 102, into the updated rewrite count table.

Operation of information processing apparatus 1 for a shutdown will be described below.

When information processing apparatus 1 receives a shutdown instruction, computing unit 102 executes step 210.

In step 210, computing unit 102 starts a shutdown process. Thereafter, computing unit 102 executes step 211.

In step 211, computing unit 102 updates table 22b. Table 22b is updated by recording unit 102e.

Specifically, recording unit 102e reads the rewrite counts of the respective erasure blocks from table 22b.

Then, recording unit 102e reads the rewrite counts of the respective erasure blocks that are recorded in the updated rewrite count table stored in main memory 101.

Then, recording unit 102e adds the rewrite count of each erasure block read from table 22b and the rewrite count of the erasure block read from the updated rewrite count table.

Then, recording unit 102e writes all the added accumulated rewrite counts back into table 22b.

After computing unit 102 updates table 22b, computing unit 102 executes step 212.

In step 212, computing unit 102 holds the data of updated accumulated rewrite count management table 22b in nonvolatile memory 106.

When the updating of table 22b is finished, recording unit 102e supplies an updating end notification to monitoring unit 102f.

After computing unit 102 holds the data of updated accumulated rewrite count management table 22b in nonvolatile memory 106, computing unit 102 executes step 213.

In step 213, computing unit 102 confirms whether the lifetime of storage device 2 has elapsed or not. The lifetime of storage device 2 is checked by monitoring unit 102f.

Specifically, monitoring unit 102f monitors the lifetime of storage device 2 based on the accumulated rewrite counts of the erasure blocks which are recorded in table 22b and rewrite endurance count 304 acquired from flash memory 22 by acquiring unit 102a.

For example, monitoring unit 102f determines whether or not a value (difference), which is produced by subtracting each of the accumulated rewrite counts of the erasure blocks from rewrite endurance count 304, is equal to or smaller than a predetermined value. The predetermined value should preferably be 0 or greater. Monitoring unit 102f determines whether the accumulated rewrite count of either one of the erasure blocks exceeds rewrite endurance count 304 or is about to exceed rewrite endurance count 304.

If the difference with respect to either one of the erasure blocks is equal to or smaller than the predetermined value, then monitoring unit 102f determines that the lifetime of storage device 2 has elapsed. If monitoring unit 102f determines that the lifetime of storage device 2 has elapsed, then computing unit 102 executes step 214.

If the differences with respect to all the erasure blocks are larger than the predetermined value, then monitoring unit 102f determines that the lifetime of storage device 2 has not elapsed. If monitoring unit 102f determines that the lifetime of storage device 2 has not elapsed, then computing unit 102 executes step 215.

In step 214, computing unit 102 produces an alarm display message. The alarm display message is controlled by monitoring unit 102f.

Specifically, monitoring unit 102f supplies an alarm display signal to display circuit 103. In response to the alarm display signal, display circuit 103 controls display unit 104 to display an alarm message indicating that the lifetime of storage device 2 has elapsed due to the repeated data rewriting, notifying the user of the elapse of the lifetime of storage device 2.

On receipt of a confirmation to the notification of the elapse of the lifetime of storage device 2 from the user, computing unit 102 executes step 215.

In step 215, computing unit 102 shuts down information processing apparatus 1.

The present embodiment offers the following advantages:

If table 22b is not present in flash memory 22, generating unit 102c generates table 22b in flash memory 22, and recording unit 102e records accumulated rewrite counts in generated table 22b.

Therefore, even if table 22b for storing accumulated rewrite counts is not preset, it is possible to monitor the lifetime of storage device 2.

Flash memory 22 has a plurality of erasure blocks and can rewrite information in each of the erasure blocks. Recording unit 102e records the accumulated rewrite counts of the respective erasure blocks into table 22b. Monitoring unit 102f monitors the lifetime of storage device 2 based on the accumulated rewrite counts of the respective erasure blocks that have been recorded in table 22b and the limitative values for the rewrite counts that have been recorded in flash memory 22.

Consequently, it is possible to monitor the lifetime of the storage device including the flash memory which is capable of rewriting information in each of the erasure blocks thereof. Information processing apparatus 1 can thus be operated while monitoring whether the rewrite count of each of the erasure blocks of flash memory 22 has reached its limit or not. It is therefore possible to prevent storage device 2 from breaking down because the rewrite counts of storage device 2 exceed the limitative values for the rewrite counts.

Flash memory 22 stores the model names of storage devices that can be connected to information processing apparatus 1, and the limitative values for the rewrite counts of flash memories included in the storage devices having the model names, in association with those model names, and also stores the model name of the storage device which includes flash memory 22 itself.

Acquiring unit 102a acquires the model name of the storage device including flash memory 22 from flash memory 22, and acquires the limitative value for the rewrite count which is associated with the acquired model name of the storage device from flash memory 22.

Monitoring unit 102f monitors the lifetime of storage device 2 based on the limitative value for the rewrite count that is acquired by acquiring unit 102a and the accumulated rewrite counts of the respective erasure blocks that are recorded in table 22b.

The erasure block size and rewrite endurance count of the flash memory vary from storage device model (type). According to the present embodiment, it is possible to acquire the limitative value for the rewrite count depending on the storage device which is actually connected. Accordingly, the lifetime of the storage device can accurately be monitored.

Flash memory 22 permanently stores serial number 22d for identifying storage device 2 that includes flash memory 22 itself. When information processing apparatus 1 is activated, acquiring unit 102a acquires serial number 22d from flash memory 22.

When information processing apparatus 1 is activated, judging unit 102b determines whether table 22b is present in flash memory 22 or not.

If judging unit 102b determines that table 22b is not present in flash memory 22, then recording unit 102e records the serial number acquired by acquiring unit 102a into table 22b generated by generating unit 102c.

If judging unit 102b determines that table 22b is present in flash memory 22, then obtaining unit 102g obtains the serial number from table 22b.

Determining unit 102h compares the serial number obtained by obtaining unit 102g and the serial number acquired by acquiring unit 102a with each other to determine whether storage device 2 has been replaced or not.

If determining unit 102h determines that storage device 2 has been replaced, then generating unit 102c deletes table 22b in flash memory 22, and thereafter generates new table 22b in flash memory 22.

Computing unit 102 manages the serial number assigned individually to storage device 2. Even when the storage device itself is replaced, therefore, computing unit 102 can automatically determine that the storage device is replaced. When the storage device is replaced, it is possible to initialize the rewrite counts of the respective erasure blocks in the newly installed storage device.

Nonvolatile memory 106 stores table 22b which is the same as table 22b generated in flash memory 22.

Therefore, even if table 22b generated in storage device 2 cannot be referred to due to a failure of storage device 2 or the like, it is possible to refer to table 22b that is stored in nonvolatile memory 106.

Display unit 104, which serves as an alarm unit, issues an alarm when monitoring unit 102f determines that the value, which is produced by subtracting the rewrite count of each erasure block from the limitative value for the rewrite count, becomes equal to or smaller than the predetermined value.

If the rewrite count of each erasure block exceeds the limitative value for the rewrite count or if the rewrite count of each erasure block is likely to exceed the limitative value for the rewrite count soon, then display unit 104 can issue an alarm with respect to the rewriting lifetime of storage device 2.

In the above embodiment, table 22*b* is updated when information processing apparatus 1 is shut down. If information processing apparatus 1 is in continuous use, however, table 22*b* may not possibly be updated for a long period of time. Consequently, recording unit 102*e* should preferably update table 22*b* not only when information processing apparatus 1 is shut down, but also periodically or at desired times.

While a preferred embodiment of the present invention has been described using specific terms, such description is for illustrative purposes only, and it is to be understood that changes and variations may be made without departing from the spirit or scope of the following claims.

What is claimed is:

1. An information processing apparatus, which is configured to be connected to a storage device including a flash memory storing a rewrite count limitative value and a serial number of said storage device, rewriting information stored in the flash memory and monitoring a lifetime of the storage device using said rewrite count limitative value, said apparatus comprising:
   a computing unit;
   an acquiring unit acquiring said serial number of said storage device from said flash memory when said information processing apparatus is activated;
   a judging unit determining whether a management table for managing an accumulated rewrite count is present in said flash memory when said information processing apparatus is activated;
   a generating unit generating said management table in said flash memory if said judging unit determines that the management table is not present in said flash memory;
   a recording unit recording said accumulated rewrite count, which indicates a number of times an information is rewritten, into said management table generated by said generating unit and recording the serial number acquired by said acquiring unit into the management table generated by said generating unit if said judging unit determines that said management table is not present in said flash memory;
   a monitoring unit monitoring the lifetime of said storage device based on the accumulated rewrite count recorded in said management table and said rewrite count limitative value;
   an obtaining unit obtaining said serial number from said management table if said judging unit determines that said management table is present in said flash memory; and
   a determining unit determining whether said storage device has been replaced by comparing the serial number obtained by said obtaining unit and the serial number acquired by said acquiring unit,
   wherein said generating unit deletes said management table and thereafter generates a new management table in said flash memory if said determining unit determines that said storage device has been replaced.

2. The information processing apparatus according to claim 1, wherein said flash memory has a plurality of storage areas each capable of rewriting information;
   said recording unit records said accumulated rewrite count of each of said storage areas into said management table; and
   said monitoring unit monitors the lifetime of said storage device based on the accumulated rewrite count of each of said storage areas recorded in said management table and said rewrite count limitative value.

3. The information processing apparatus according to claim 2, wherein said flash memory stores a model name of the storage device which is connectable to said information processing apparatus and the rewrite count limitative value of the flash memory included in the storage device having the stored model name, in association with said model name, and stores the model name of the storage device which includes said flash memory, said information processing apparatus further comprising:
   said acquiring unit acquiring the model name of the storage device which includes said flash memory from said flash memory, and acquiring the rewrite count limitative value associated with the model name of the storage device from said flash memory;
   wherein said monitoring unit monitors the lifetime of said storage device based on the rewrite count limitative value acquired by said acquiring unit and the accumulated rewrite count of each of said storage areas recorded in said management table.

4. The information processing apparatus according to claim 1, further comprising:
   a nonvolatile memory storing same management table as the management table generated in said flash memory.

5. The information processing apparatus according to claim 1, wherein said monitoring unit determines whether a value that is produced by subtracting said accumulated rewrite count from said rewrite count limitative value is smaller than a predetermined value, said information processing apparatus further comprising:
   an alarm unit issuing an alarm if said monitoring unit determines that the value produced by subtracting said accumulated rewrite count from said rewrite count limitative value is smaller than said predetermined value.

6. A method of monitoring a lifetime, carried out by an information processing apparatus, which is configured to be connected to a storage device including a flash memory storing a rewrite count limitative value and a serial number of said storage device, for rewriting information stored in the flash memory and monitoring the lifetime of the storage device using said rewrite count limitative value, the method comprising the steps of:
   acquiring said serial number of said storage device from said flash memory when said information processing apparatus is activated;
   determining whether a management table for managing an accumulated rewrite count is present in said flash memory when said information processing apparatus is activated;
   generating said management table in said flash memory if the management table is not present in said flash memory;
   recording an accumulated rewrite count, which indicates a number of times an information is rewritten, into said management table which is generated;
   monitoring the lifetime of said storage device based on the accumulated rewrite count recorded in said management table and said rewrite count limitative value;
   recording the serial number, which is acquired, into the management table that is generated if said management table is not present in said flash memory;
   obtaining said serial number from said management table if said management table is present in said flash memory; and determining whether said storage device has been replaced by comparing the serial number that is obtained and the serial number that is acquired, wherein said generating comprises deleting said management table and thereafter generating a new management table in said flash memory if said storage device has been replaced.

7. The method according to claim 6, wherein said flash memory has a plurality of storage areas each capable of rewriting information;

said step of recording comprises the step of recording said accumulated rewrite count of each of said storage areas into said management table; and said step of monitoring comprises the step of monitoring the lifetime of said storage device based on the accumulated rewrite count of each of said storage areas recorded in said management table and said rewrite count limitative value.

8. The method according to claim 7, wherein said flash memory stores a model name of the storage device which is connectable to said information processing apparatus and the rewrite count limitative value of the flash memory included in the storage device having the stored model name, in association with said model name, and stores the model name of the storage device which includes said flash memory, said method further comprising the step of:

acquiring the model name of the storage device which includes said flash memory from said flash memory, and acquiring the rewrite count limitative value associated with the model name of the storage device from said flash memory;

wherein said step of monitoring comprises the step of monitoring the lifetime of said storage device based on the rewrite count limitative value and the accumulated rewrite count of each of said storage areas recorded in said management table.

9. The method according to claim 6, further comprising the step of:

storing same management table as the management table generated in said flash memory, in a nonvolatile memory.

10. The method according to claim 6, wherein said step of monitoring comprises the step of determining whether a value that is produced by subtracting said accumulated rewrite count from said rewrite count limitative value is smaller than a predetermined value, said method further comprising the step of:

issuing an alarm if the value that is produced by subtracting said accumulated rewrite count from said rewrite count limitative value is smaller than said predetermined value.

* * * * *